US006427069B1

United States Patent
Galin

(10) Patent No.: US 6,427,069 B1
(45) Date of Patent: Jul. 30, 2002

(54) BALANCED ALL-WAVELENGTH SUB-MILLIMETER MICROWAVE SUBHARMONIC MIXER

(76) Inventor: Israel Galin, 1560 Lowel Ave., Claremont, CA (US) 91711

( * ) Notice: Subject to any disclaimer, the term of this patent is extended or adjusted under 35 U.S.C. 154(b) by 0 days.

(21) Appl. No.: 09/569,432

(22) Filed: May 12, 2000

(51) Int. Cl.$^7$ .................................................. H04B 1/26
(52) U.S. Cl. ........................................ 455/326; 455/328
(58) Field of Search ................................ 455/326, 328, 455/323, 330, 313, 325, 302–306; 333/248, 239

(56) References Cited

U.S. PATENT DOCUMENTS

| | | | | |
|---|---|---|---|---|
| 4,099,228 A | * | 7/1978 | Cohn | 363/159 |
| 4,229,828 A | * | 10/1980 | Baird et al. | 455/326 |
| 4,955,079 A | * | 9/1990 | Connerney et al. | 455/325 |
| 5,265,268 A | * | 11/1993 | Tahim | 455/328 |
| 5,553,319 A | * | 9/1996 | Tanbakuchi | 455/326 |
| 5,832,376 A | * | 11/1998 | Henderson et al. | 455/327 |
| 6,198,912 B1 | * | 3/2001 | Piloni | 455/325 |
| 6,317,590 B1 | * | 11/2001 | Nash et al. | 455/331 |

* cited by examiner

*Primary Examiner*—Vivian Chang
*Assistant Examiner*—Duc Nguyen
(74) *Attorney, Agent, or Firm*—Leonard Tachner

(57) ABSTRACT

A mixer converts input power at high-frequency RF into output power at a different and much lower frequency IF, with the assistance of another high-frequency oscillator (LO). Typically, a very low IF frequency requires an LO that approximates the RF frequency. However, a subharmonic mixer facilitates low IF with LO frequencies significantly lower than the RF frequency. This balanced odd-subharmonic mixer consists primarily of a four-port BALUN and a pair of diodes. The diodes terminate two ports of the BALUN connecting in series and in anti-parallel to the remaining external BALUN ports. The external BALUN ports constitute the RF and the LO high-frequency mixer ports. The mixer's lower-frequency IF port also connects to the diodes, comprising a separate channel that is co-linear with one BALUN external port, and coupling capacitively to the other. All three mixer ports meet at a mixing chamber (part of the BALUN) where the diodes are located.

8 Claims, 4 Drawing Sheets

BALANCED ALL-WAVELENGTH SUB-MILLIMETER MICROWAVE SUBHARMONIC MIXER

BACKGROUND OF THE INVENTION

1. Field of the Invention

The present invention relates generally to high-frequency mixers and more specifically, to an odd-subharmonic balanced mixer for sub-millimeter-waves. This new mixer yields improved conversion efficiency, lower output noise, superior cross-port isolation, improved impedance matching, and ease of fabrication at receiver frequencies on the order of several hundred gigahertz.

2. Prior Art

A mixer is a critical component of modern radio-frequency (RF) systems. It is usually the first or second device after the RF antenna input. Various mixer parameters, such as bandwidth and inter-port isolation, must be optimized to produce devices capable of performing in modern RF systems.

In recent years there has been an increase in sub-millimeter-wave receiver applications requiring easily producible and improved performance mixer technology at these extremely high frequencies.

One reason frequency conversion is done is to make signal processing easier and less expensive. Changing the frequency of a signal without altering its information content is necessary because signal processing components, such as amplifiers, are much less expensive and work better when they are designed to operate at lower frequencies.

Another reason for frequency conversion is to allow for the practical transmission of low-frequency information (such as audio information) through space. Transmitting audio frequency (up to 20 KHz) signals directly would require antennas of impractically large size because of the relatively long wavelengths of audio signals. However, if the audio signals are first converted up in frequency to a much higher carrier frequency, antennas of practical size can be utilized. At the receiving end, it is necessary to capture part of the electromagnetic energy of the transmitted signal and reconvert it back down to the audio frequency range in order to extract the original low-frequency information. Thus, both transmission and receiving require an input signal to be converted. Mixers perform this frequency conversion.

Mixing an input RF signal with an LO signal yields frequency products below and above the RF and LO frequencies. Each frequency product corresponds to the sum of the input RF and LO frequencies, while the lower frequency product corresponds to the difference between the input RF and LO frequencies. Usually, it is the lower frequency product (the "down-converted" RF signal) which is used in receiving systems, whereas the high frequency product (the "up-converted" RF signal) which is used in transmission systems. A non-linear element, e.g., diode, is essential for frequency conversion of any sort.

There are basically four types of mixers: each with a different number of diodes: single-ended, single-balanced, double-balanced, and double double-balanced (also called triple-balanced). However, all types are three-port devices and comprise an input port (the RF port), a local oscillator input port (the LO port), and an output port (the IF port). Single-ended mixers are the simplest type and are realized using only a single diode. The LO, RF and IF ports are separated only by filters to provide some degree of inter-port isolation. Single-ended mixers, however, have a narrow bandwidth, limited dynamic range and poor inter-port isolation.

Broader bandwidths and better isolation can be obtained with a single-balanced mixer. A single-balanced mixer consists of two single ended mixers. The mixer diodes are fed by the LO and RF signals through a BALUN which yields inter-port isolation between the LO and RF ports. Double-balanced mixers are so called because they have two BALUNs instead of just one and comprise two single-balanced mixers. This enables inter-port isolation both between the LO and RF ports and between the LO and IF ports. Double-balanced mixers use twice the number of diodes (four) as a singly-balanced mixer and the diodes are usually, although not always, arranged in a diode "quad" ring configuration.

Triple-balanced mixers are so called because, in addition to BALUNs on the RF and LO ports, the IF port is also balanced. A triple-balanced mixer requires twice the number of diodes (eight) as a doubly-balanced mixer and a triple-balanced mixer is usually realized by combining two diode quad ring mixers.

The mechanism by which a diode mixer converts energy from one frequency to another is generally well known. A diode which is pumped by a signal from a local oscillator at a frequency fLO responds as a switch that is closed during the conducting portion of the LO voltage cycle and open during the non-conducting part of the cycle. This switching action modulates an incident RF signal at a frequency fRF and thereby makes available output signals at numerous frequencies different from and in addition to the incident RF and LO signals. The relationship between the various additional output signals is fIF=½kfLO±fRF½, where fIF is the output frequency and k and I are integers (at low level external inputs I=1). If, for example, k=1, the mixer is considered a fundamental mixer.

Harmonic mixers have been utilized in which k>1, hence the principal output is fIF=½mfLO±fRF½ that is, at a particular "m" th harmonic of the LO frequency. These mixers have used filters to block responses corresponding to k ¹m. The main disadvantage to this type of mixer is that the conversion-loss is relatively high because of the limited success of filters to prevent RF signal energy to convert into unintended outputs.

A more recent type of even subharmonic (2n) pumped mixer uses two diodes connected in parallel and opposing polarity, that is, antiparallel (n is any integer). These form a semiconductor switch which is toggled at $2nf_{LO}$ and, consequently, output frequencies fIF are available only as combination of even harmonics of the local oscillator frequency.

As background, existing forms of the two-diode, subharmonic pumped mixers are described in literatures such as:

E. R. Carlson et al, "Subharmonically Pumped Millimeter-Wave Mixers," Vol. MTT-26, pp. 706–715, October 1978;

M. V. Schneider and W. W. Snell, Jr., "Harmonically Pumped Stripline Down-Converter," Vol. MTT-23, pp. 271–275, March 1975; and M. Cohn et al, "Harmonic Mixing With An Antiparallel Diode Pair," Vol. MTT-23, pp. 667–673, August 1975.

Said "MTT" volumes being the IEEE Transactions on Microwave Theory and Techniques.

An example of a balanced mixer utilizing a subharmonic pumped antiparallel diode pair is disclosed in U.S. Pat. No. 3,983,489, issued Sept. 28, 1976 to Gittinger. This type of mixer, in which transformer coupling is used to isolate the RF and LO ports, can achieve wide bandwidth in the UHF frequency range but is not usable at microwave frequencies due to limitations of the transformer devices used therein.

A search of the prior art has revealed the following U.S. patents which appear pertinent in varying degrees to the present invention:
U.S. Pat. No. 3,311,811 Rupp
U.S. Pat. No. 4,145,692 Armstrong et al
U.S. Pat. No. 4,320,536 Dietrich
U.S. Pat. No. 4,392,255 Del Giudice
U.S. Pat. No. 4,394,632 Hu
U.S. Pat. No. 4,485,488 Houdart
U.S. Pat. No. 4,491,977 Paul
U.S. Pat. No. 4,730,169 Li
U.S. Pat. No. 4,803,419 Roos
U.S. Pat. No. 4,817,200 Tanbakuchi
U.S. Pat. No. 4,994,755 Titus et al
U.S. Pat. No. 5,060,298 Waugh et al
U.S. Pat. No. 5,077,546 Carfi et al
U.S. Pat. No. 5,266,963 Carter
U.S. Pat. No. 5,446,923 Martinson et al
U.S. Pat. No. 5,517,687 Niehenke et al
U.S. Pat. No. 5,553,319 Tanbakuchi
U.S. Pat. No. 5,721,514 Crockett et al
U.S. Pat. No. 5,740,528 Drennen
U.S. Pat. No. 5,819,169 Fudem
U.S. Pat. No. 5,844,939 Scherer et al Of the aforementioned patents, the following appear to be the most relevant:

U.S. Pat. No. 5,553,319 to Tanbakuchi is directed to a routing YIG tuned mixer. A routing YIG tuned resonating filter integrated with an image enhanced double-balanced mixer is provided. FIG. 10 is a schematic diagram of an image enhanced double-balanced YIG tuned mixer 305 which mixes a fundamental or odd-harmonic products of the local oscillator signal with the RF input signal to produce a predetermined low frequency IF signal output. As shown in FIG. 10, the mixer 305 comprises a second half loop of coupling loop 138 and a full output coupling loop 142 in which coupling loop 142 is continuous at a first end and connected to low output 194. Output coupling loop 142 is terminated at a second end by a monolithic GaAs diode integrated circuit comprising a Schottky diode bridge. Mixer 305 further comprises a single IF BALUN 306. IF BALUN 306 functions as a fundamental and odd harmonic IF BALUN.

U.S. Pat. No. 5,446,923 to Martinson et al is directed to a mixer using fundamental frequency or second or third harmonic frequencies of a local oscillator for maximized resultant frequency mixer product. This device shows that the third harmonic mixing can be accomplished provided that the mixing element is a two terminal device having a substantially symmetrical non-linear forward and reverse voltage current characteristic. Also required is that it have a pair of conduction threshold voltages which are substantially symmetrical above and below zero volts, beyond which the mixing element will be conductive at least when a signal from a local oscillator is imposed on the mixing element. The idealized reflection coefficient waveform has a fundamental frequency that is equal to the fundamental frequency of the local oscillator when the second DC component of bias voltage is imposed across the mixing element so as to give the maximized resultant frequency fIN±fLO. The idealized reflection coefficient waveform has a large amplitude component that is at a frequency which is three times the fundamental frequency of the local oscillator when the third DC component of bias voltage is imposed across the mixing element so as to give the maximized resultant frequency fIN±fLO.

U.S. Pat. No. 4,994,755 To Titus et al is directed to an active BALUN. FIG. 1 shows an active double BALUN that may be used in a double BALUN mixer. With such an arrangement, the double BALUN provides two outputs, RFLO and RFLO. These signals are down-converted to an IF frequency, the difference frequency between RF and LO. Any unconverted RF or LO will substantially cancel at the output of the mixer because of the 180 degree phase shift difference. Even order harmonic products will be substantially canceled by this arrangement. The harmonic generation occurs in the mixer according to the formula IF=±nRF±mLO. The harmonic order for a doubly balanced mixer refers to the harmonic order product n+m. For example, 2RF–LO is a third order odd harmonic product. The fourth order even harmonic product is 2RF–2LO. The even order product is canceled by this double balanced mixer arrangement. FIG. 11 shows an embodiment of this device in which active devices at the single input BALUN operate in the non-linear mode to produce harmonics of the RF. With this arrangement, even harmonics of the RF will be canceled and odd harmonics of the RF will be coupled to the output terminal.

U.S. Pat. No. 4,817,200 to Tanbakuchi is directed to a tracking YIG tuned filter mixer. FIG. 5 shows the YIG resonator 304 and its associated circuitry function to mix the filtered RF signals which appear on line 305 with the local oscillator signals on line 319. The input of full loop 381 is connected to line 319 which carries the local oscillator signal. Two diodes 385 and 387 are connected in series across the output side of full loop 381 and output line 317 is connected to the junction between the diodes. A matching network 391 is connected to line 317 near the junction point between the diodes. This mixer is an odd harmonic mixer in which the IF signal at a frequency of FIF=(2+1) (FLO)±FRF flows through the local oscillator IN port and the IF output port.

U.S. Pat. No. 5,844,939 to Scherer et al is directed to a low-cost phase-locked local-oscillator for millimeter-wave transceivers. The transceiver includes a transceiver oscillator and a receiver mixer. The transceiver oscillator generates a transceiver drive signal. The receiver's mixer mixes a received modulated signal with a harmonic of the transceiver drive signal to generate an intermediate frequency receive signal. FIG. 2 shows an embodiment in which the transceiver drive mixer 44 is a harmonic mixer in which an odd harmonic of the intermediate transmit oscillator signal is mixed with the transceiver drive signal. Typically, the third or fifth harmonic of the intermediate transmit signal is mixed with the transceiver signal.

SUMMARY OF THE INVENTION

The invention accomplishes a high performance mixing function with a third harmonic of a local oscillator as part of a heterodyne receiver-facilitating the utilization of lower frequency local-oscillators for higher frequency receivers (e.g., a 150 GHz local-oscillator in a 450 GHz receiver). The invention generally overcomes the technological gap created between rapid increase in sub-millimeter-wave receiver applications, and slow advancements in local-oscillator technology.

Furthermore, specifically, this invention also overcomes mixer fabrication difficulties associated with implementations of balanced mixers at millimeter and sub-millimeter wave frequencies—demonstrating a simple implementation of an all waveguide solution.

The inventive balanced sub-harmonic mixer features performance advantages relative to single-ended sub-harmonic mixers operating with an identical frequency harmonic of the local-oscillator. The two-diode balanced mixer configuration features symmetry which suppresses, without filters, a significant amount of undesired frequency down conversion combinations in favor of desired ones, yielding better conversion-loss, lower output noise, and superior cross-port isolation, relative to one diode conventional sub-harmonic mixers. The two-mixer diode balanced mixer configuration also yields significantly easier design requirements at the input and output mixer ports yielding easier, wider and better impedance matching relative to one diode conventional sub-harmonic mixers.

This invention embodies a unique, easy to produce implementation of a balanced mixer sub-harmonically driven, particularly attractive for millimeter-wave and sub-millimeter-wave receivers.

The relationships between E-vectors and mixer diodes (mounted on an additional printed-circuit on dielectric substrate at the BALUN) are at the "heart" of this mixer invention. These relations facilitate diodes' LO drives out-of phase, and the series distribution of the RF signal on the same pair of diodes.

This invention embodies a unique implementation of a balanced mixer circuit structure facilitating ease of fabrication of balanced mixers at millimeter and sub-millimeter wave frequencies. Particularly, this invention embodies a balanced mixer implemented as an odd-sub-harmonic balanced mixer—facilitating "stretching" useful employment of lower frequency LOs for higher band receivers. At the "heart" of the invention is a unique realization of a balanced-unbalanced (BALUN) network—a network required for implementing balanced mixers.

OBJECTS OF THE INVENTION

It is a principal object of the present invention to provide a balanced mixer for sub-millimeter frequencies practical to produce and which yields lower conversion loss, lower noise, better cross-port isolation and impedance matching.

It is another object of the invention to provide a two-mixer diode balanced mixer using an augmented sub-harmonic driven local oscillator for high frequency receivers.

It is still an additional object of the invention to provide an odd-sub-harmonic balanced mixer implemented with a mixer diode assembly positioned within a mechanical "all" waveguide structure.

BRIEF DESCRIPTION OF THE DRAWINGS

The aforementioned objects and advantages of the present invention, as well as additional objects and advantages thereof, will be more fully understood hereinafter as a result of a detailed description of a preferred embodiment when taken in conjunction with the following drawings in which.

DETAILED DESCRIPTION OF A PREFERRED EMBODIMENT

Figure 2:
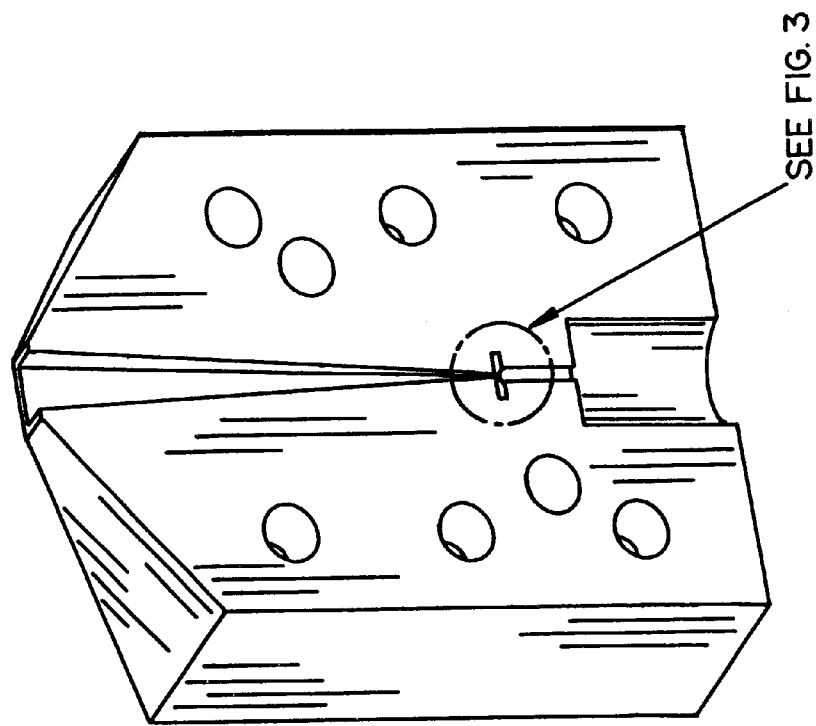
FIG. 2 is a broken-away view of the interior of the waveguide structure of FIG. 1.
Figure 1:
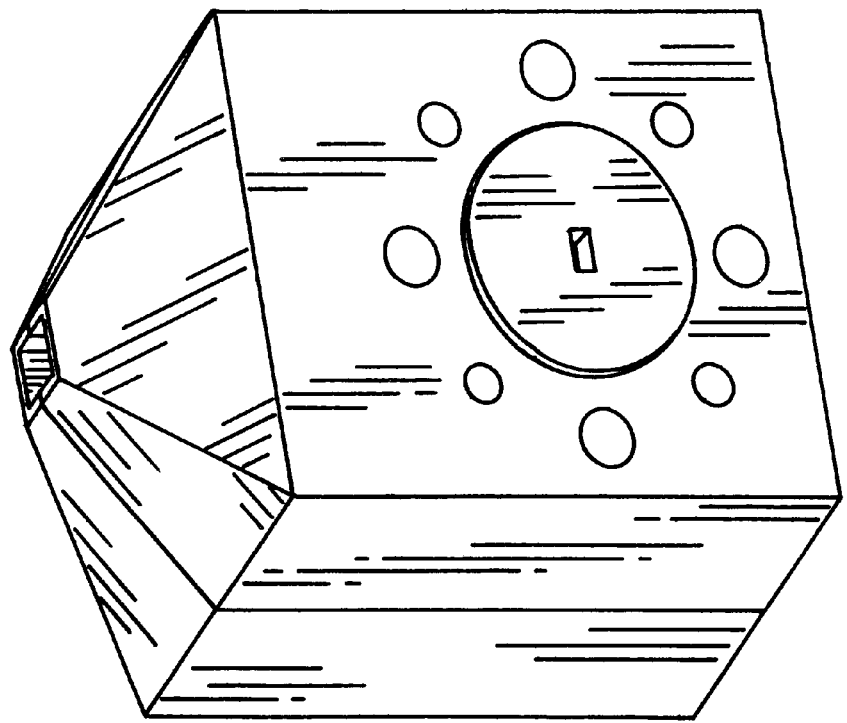
FIG. 1 is a three-dimensional view of a waveguide structure of a preferred embodiment of the invention.
Figure 3:
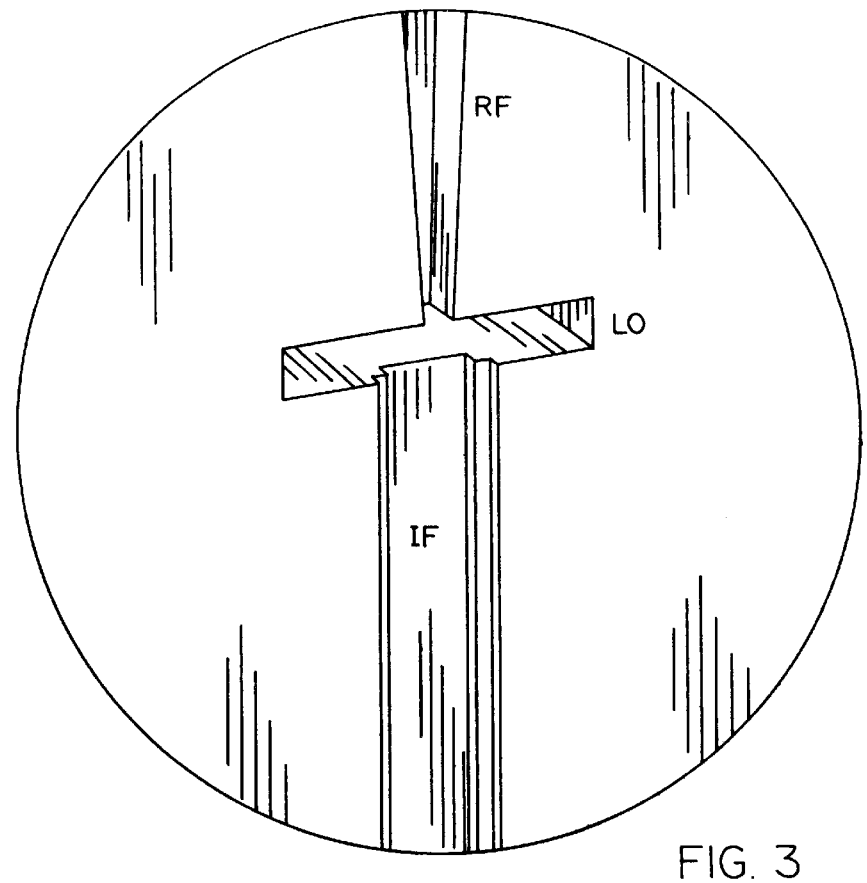
FIG. 3 is an enlarged view of the area of FIG. 2 encircled and labeled "see FIG. 3"

FIGS. 1 and 2 show an implementation of a mixer in accordance with the invention and depicting a waveguide structure which embodies the mechanical aspects of the invention. The RF/LO/IF mixer ports reveal, in FIG. 2, their physical relations at their common junction (enlarged in "FIG. 3"). The RF waveguide (with an integral feed-horn) and the LO waveguide are connected orthogonally, to form an RF/LO junction, assuring RF to-and-from LO/IF ports isolation.

The relationships between E-vectors and mixer diodes (mounted on an additional printed-circuit on dielectric substrate at the BALUN) are at the "heart" of this mixer invention. These relations facilitate a diodes' LO drive out-of phase, and the series distribution of the RF signal on the same pair of mixer diodes.

Figure 4:
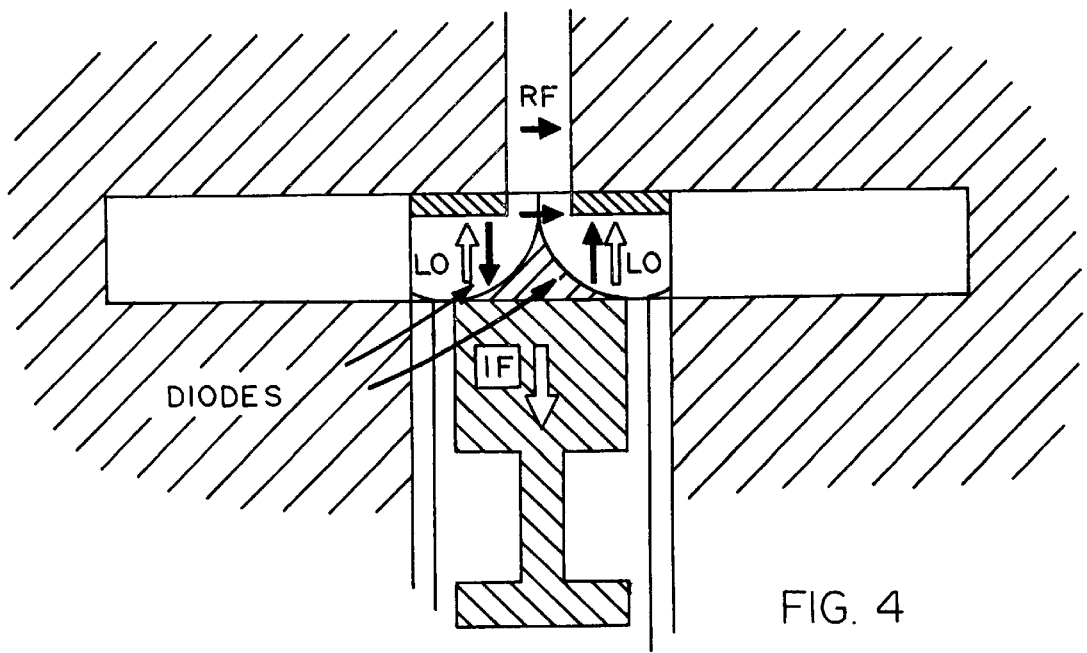
FIG. 4 is a conceptual illustration of the diode locations relative to E-vectors of the RF and LO portions of the mixer of the invention.

FIG. 4 depicts a version of the printed-circuit on a dielectric substrate in relation to the RF/LO waveguide junction indicating the diode locations and E-vectors. The printed circuit on dielectric substrates bridges the RF/LO junction with the IF port as shown in FIG. 4.

Figure 5:
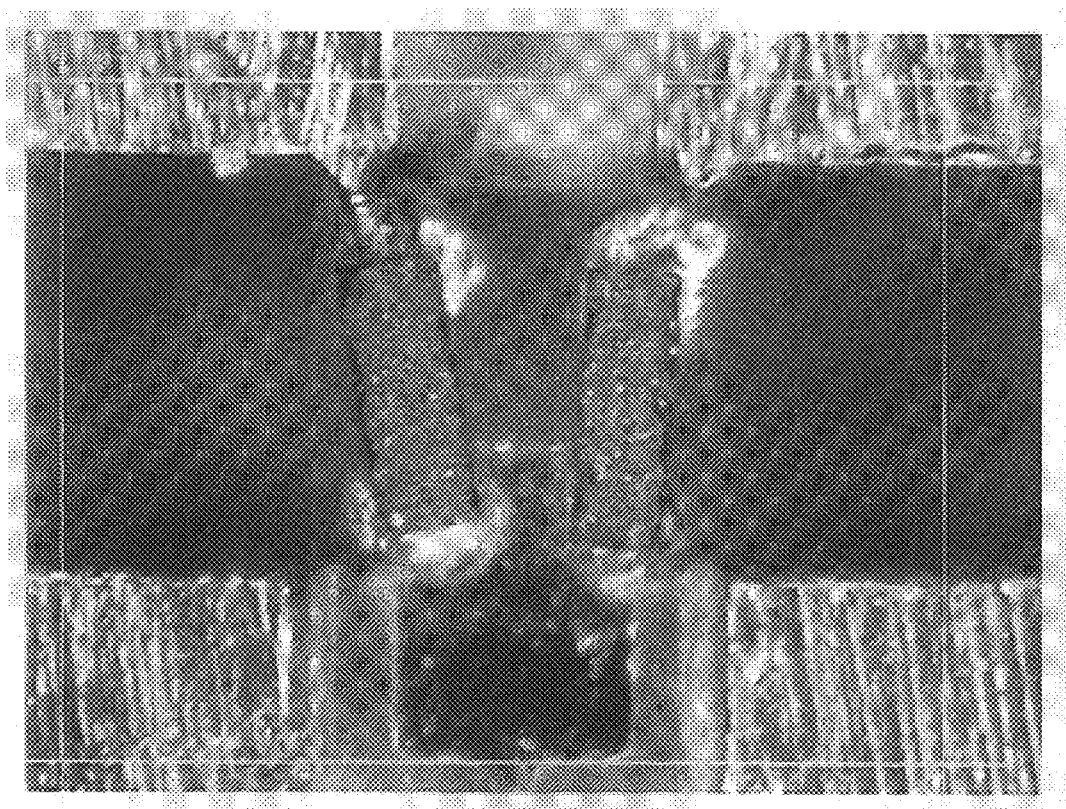
FIG. 5 is a photograph of the mixer junction of the invention.

FIG. 5 shows an assembly of the two diodes mounted on the dielectric substrate, galvanically bonded to the printed circuit deposited on the dielectric and located at the RF/LO junction.

Figure 6:
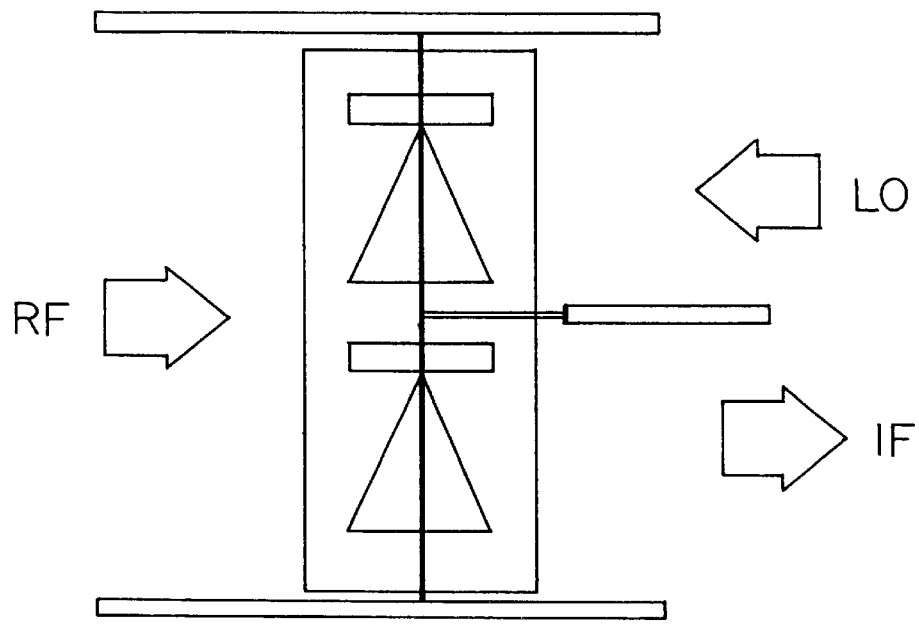
FIG. 6 is an electrical equivalent circuit of the mixer of the invention.

FIG. 6 depicts the electrical equivalent representing this mixer invention, depicting two mixer diodes intra-connected in series and collectively connected also in series to the RF mixer port. However, the same pair of mixer diodes represents a parallel intra-connection, collectively connected in parallel to the LO and IF mixer ports. Such connections, between the diodes and the diodes as a collective to the mixer ports, required a BALUN network and facilitates fundamental (×1) and/or odd-sub-harmonic (×(2+1)) driven mixing. Filters (not shown) at the various mixer ports determine the specific mixer properties—e.g., fundamental sub-harmonic (×3), sub-harmonic (×5), et cetera.

Figure 7:
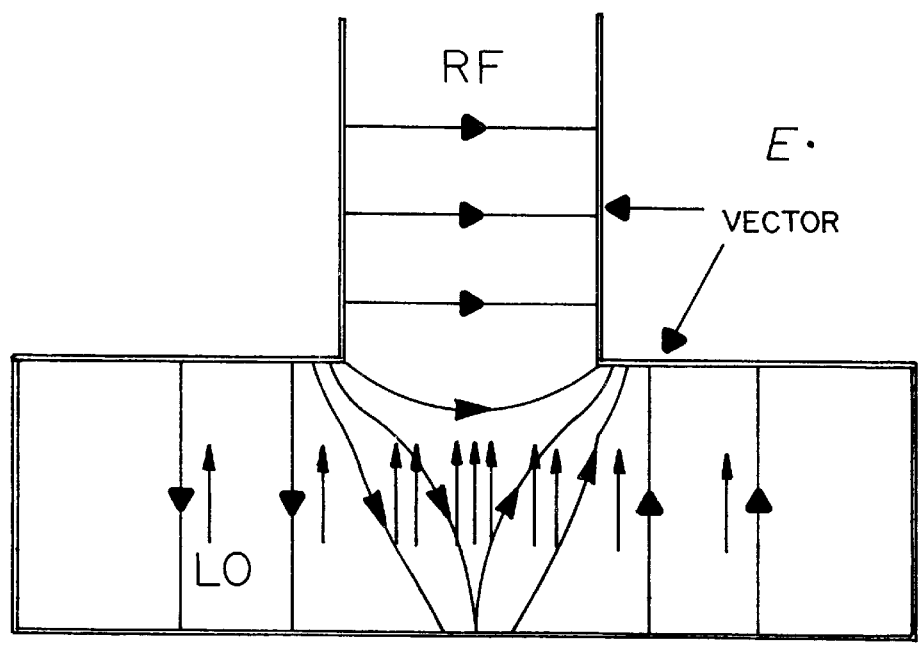
FIG. 7 is a vector diagram illustrating the orientation of E-vectors in the mixing region of the invention.

FIG. 7 shows the common plan of the RF/LO junction with their respective E-vectors, depicting the RF E-vectors in the RF and LO waveguides (dark head arrows), and the E-vectors of the LO in the LO waveguide (light head arrows), while LO E-vectors are canceled in the RF waveguide. The characteristics of the different E-vectors establish the common RF/LO junction as a waveguide balanced-unbalanced (BALUN) network required to realize the electrical equivalent circuit described in conjunction with FIG. 6.

Prototype mixers embodying the invention have been constructed and tested at 318 GHz, at 420 GHz, and 450 GHz—results are encouraging (particularly excellent results had been demonstrated at 318 GHz).

This invention thus embodies a unique implementation of a balanced mixer circuit structure—facilitating ease of fabrication of balanced mixers at millimeter and sub-millimeter wave frequencies. Particularly, this invention embodies a balanced mixer implemented as an odd-sub-harmonic balanced mixer—facilitating useful implementation of lower frequency LOs for higher band receivers. At the "heart" of the invention is a unique realization of a balanced-unbalanced (BALUN) network. A particularly novel aspect of the invention is the implementation of a sub-millimeter mixer in an all-waveguide structure. As an all-rectangular waveguide BALUN, the invention embodies larger dimensions than waveguide/coax structures and is therefore easier to fabricate for any given operating frequency.

Having thus disclosed a preferred embodiment of the invention, it will be apparent that there may be modifications and additions which will now occur to those having skill in the pertinent arts with the benefit of the teaching herein.

For example, while particular frequencies of operation have been disclosed, it will be recognized that the apparatus may be advantageous at many other frequencies of operation. Moreover, while the present invention has been disclosed as a mixer, it should now be apparent that other frequency conversion applications such as balanced multipliers at sub-millimeter frequencies, would also benefit from the present invention. Accordingly,

What is claimed is:

1. A waveguide BALUN and diodes apparatus for sub-millimeter frequency mixing of a local oscillator signal with an RF signal to generate an intermediate frequency signal; the apparatus comprising:

a rectangular waveguide structure having a rectangular waveguide channel for receiving said RF signal, and a rectangular waveguide channel for receiving said local oscillator signal and a channel for output transmission of said intermediate frequency signal; said first two waveguide channels being substantially orthogonal to each other and intersecting at a mixing chamber, said third channel being substantially co-linear with said first channel and extending oppositely thereto from said mixing chamber; and at least two diodes within said chamber, said diodes being connected in series relative to said first channel and in anti-parallel relative to said other channels.

2. The apparatus recited in claim 1 wherein said channels are of appropriate size relative to wavelength of said RF signal, said local oscillator signal and said intermediate frequency signal providing an intermediate frequency which is the frequency difference of the said RF signal and an odd subharmonic of said local oscillator signal.

3. The apparatus recited in claim 1 wherein said channels are of appropriate size relative to the wavelengths of said RF signal, said local oscillator signal and said intermediate frequency signal to operate at RF wavelengths that are less than one millimeter.

4. The apparatus recited in claim 1 wherein said RF signal has a frequency which is about three times the frequency of said local oscillator signal.

5. The apparatus recited in claim 1 wherein said RF signal has a frequency that is between 300 GHz and 3000 GHz.

6. An all-rectangular waveguide apparatus for sub-millimeter balanced frequency conversion; the apparatus comprising:

first waveguide port for transmission of a high frequency signal, a second waveguide port for transmission of a conversion frequency signal and a third waveguide port for transmission of a low frequency signal; said waveguide ports all intersecting at a conversion chamber having at least two non-linear devices for generating sums and differences of said signals; said non-linear devices being connected in series with said first waveguide port and anti-parallel with said second and third waveguide ports.

7. The apparatus recited in claim 6 wherein said non-linear devices are diodes.

8. The apparatus recited in claim 6 wherein said frequency conversion is for heterodyne mixing.

* * * * *